(12) United States Patent
Lee et al.

(10) Patent No.: US 10,916,492 B2
(45) Date of Patent: Feb. 9, 2021

(54) SEMICONDUCTOR SUBSTRATE AND METHOD OF MANUFACTURING THE SAME

(71) Applicant: Advanced Semiconductor Engineering, Inc., Kaohsiung (TW)

(72) Inventors: Tsann Huei Lee, Kaohsiung (TW); Lu-Ming Lai, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/977,966

(22) Filed: May 11, 2018

(65) Prior Publication Data

US 2019/0348351 A1 Nov. 14, 2019

(51) Int. Cl.
*H01L 23/49* (2006.01)
*H01L 23/498* (2006.01)
*H01L 21/48* (2006.01)

(52) U.S. Cl.
CPC ...... *H01L 23/49811* (2013.01); *H01L 21/486* (2013.01); *H01L 23/49827* (2013.01); *H01L 23/49866* (2013.01)

(58) Field of Classification Search
None
See application file for complete search history.

(56) References Cited

U.S. PATENT DOCUMENTS

| 5,831,333 | A | * | 11/1998 | Malladi | H01L 23/34 257/712 |
| 2006/0001179 | A1 | * | 1/2006 | Fukase | H01L 23/49827 257/778 |
| 2013/0012079 | A1 | * | 1/2013 | Sakae | H01M 2/206 439/884 |
| 2018/0261935 | A1 | * | 9/2018 | Huang | H01R 13/415 |

FOREIGN PATENT DOCUMENTS

TW M553885 1/2018

* cited by examiner

*Primary Examiner* — Bilkis Jahan
(74) *Attorney, Agent, or Firm* — Foley & Lardner LLP

(57) ABSTRACT

A semiconductor substrate and a method of manufacturing the same are provided. The semiconductor substrate includes a carrier and a conductive post. The carrier has a first surface, a second surface opposite to the first surface and a lateral surface extending between the first surface and the second surface. The carrier has a through hole extending between the first surface and the second surface. The carrier has a first opening on the lateral surface. The conductive post is disposed within the through hole.

19 Claims, 5 Drawing Sheets

SEMICONDUCTOR SUBSTRATE AND METHOD OF MANUFACTURING THE SAME

BACKGROUND

1. Technical Field

The present disclosure relates to a semiconductor substrate and a method for manufacturing a semiconductor substrate.

2. Description of the Related Art

In semiconductor device packages including various kinds of electronic components, the heights or the thicknesses of the electronic components may be different from each other. In some applications (e.g., optical devices), the electronic components should be disposed at a similar level, and thus an interposer is disposed between a substrate and a relatively thinner electronic component to increase its height or thickness. However, due to the limitation of the process for manufacturing an interposer, the distortion or the tolerance of the thickness of the interposer is relatively high (e.g., more than 10%). It is desirable to develop an interposer with a precisely-controlled thickness or height.

SUMMARY

In accordance with an aspect of the present disclosure, a semiconductor substrate includes a carrier and a conductive post. The carrier has a first surface, a second surface opposite to the first surface and a lateral surface extending between the first surface and the second surface. The carrier has a through hole extending between the first surface and the second surface. The carrier has a first opening on the lateral surface. The conductive post is disposed within the through hole.

In accordance another aspect of the present disclosure, a semiconductor package includes a semiconductor substrate, a conductive contact and an electronic component. The semiconductor substrate has a carrier and a conductive post. The carrier has a first surface, a second surface opposite to the first surface and a lateral surface extending between the first surface and the second surface. The carrier has a through hole extending between the first surface and the second surface. The carrier has a first opening on the lateral surface adjacent to the first surface of the carrier. The conductive post is disposed within the through hole. The conductive contact is disposed on the first surface of the carrier. The electronic component is disposed on the first surface of the carrier and electrically connected to the conductive post through the conductive contact.

In accordance another aspect of the present disclosure, a method for manufacturing a semiconductor package includes (a) providing a carrier having a through hole penetrating the carrier and an opening on a lateral surface of the carrier, wherein the through hole is connected to the opening; (b) disposing a conductive post within the through hole and (c) connecting an electronic component to the conductive post through a conductive contact.

Figure 1A:
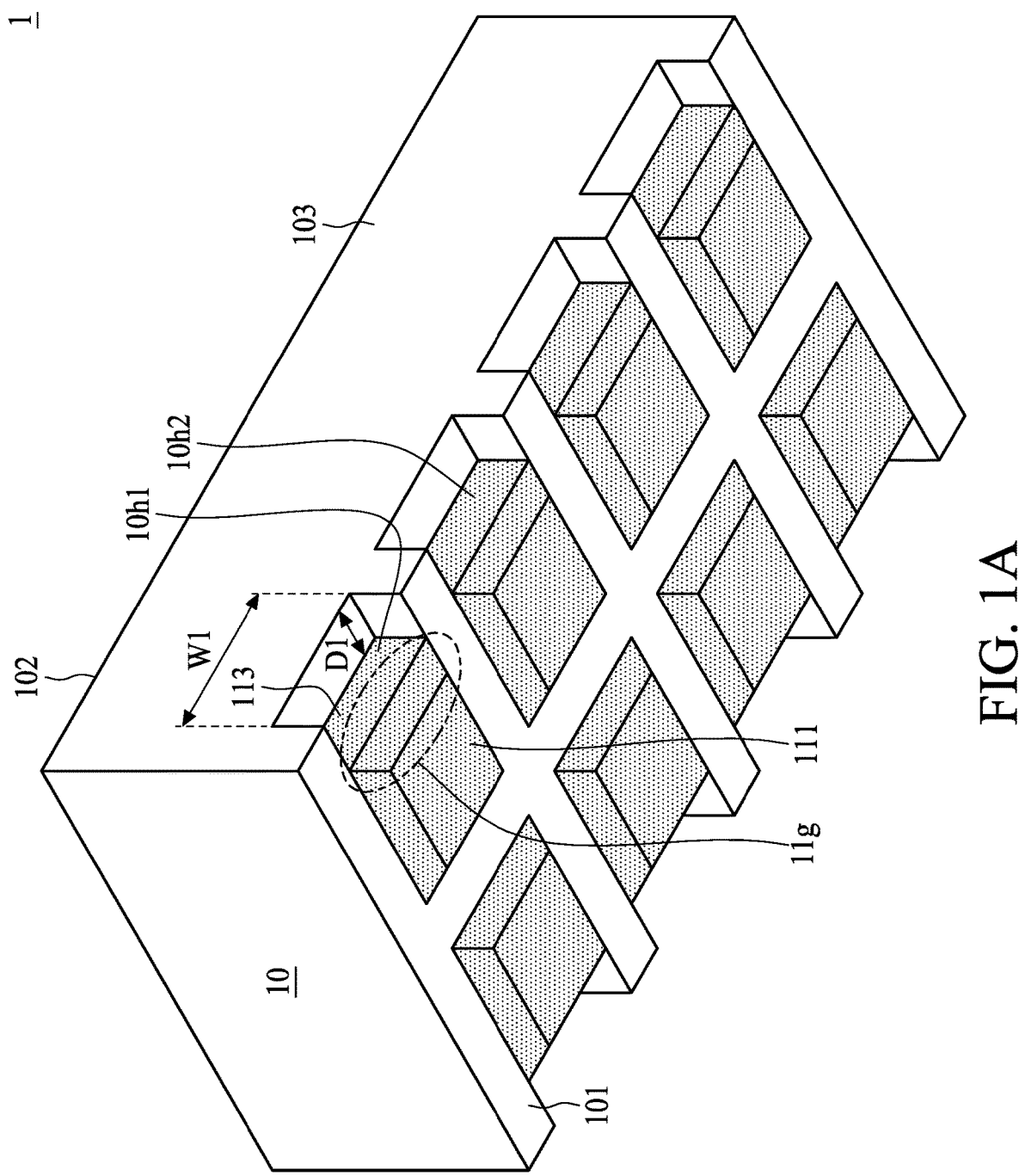
FIG. 1A illustrates a perspective view of a substrate in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1A illustrates a perspective view of a substrate 1 (or interposer) in accordance with some embodiments of the present disclosure. The substrate 1 includes a carrier 10 and a plurality of conductive posts 11.

The carrier 10 has a surface 101 (also referred to as a first surface), a surface 102 (also referred to as a second surface) opposite to the surface 101 and a surface 103 (also referred to as a lateral surface) extending between the surface 101 and the surface 102. The carrier 10 has a plurality of through holes (or openings) penetrating the carrier 10 and filled by the conductive posts 11. For example, the though holes extend between the surface 101 and the surface 102. The through holes are separated from each other. For example, a through hole is not connected to any of the adjacent through holes. In some embodiments, the carrier 10 is formed of or includes polymer or resin. In some embodiments, the carrier 10 can be formed by injection molding technique, and the distortion or tolerance of the thickness of the carrier 10 is less than 1%. In some embodiments, the thickness of the carrier 10 is equal to or greater than 1 millimeter (mm).

In some embodiments, the carrier 10 has a plurality of openings 10h1, 10h2 on its surface 103 to expose a portion of each of the conductive posts 11. The openings 10h1, 10h2 are separated from each other. For example, the opening 10h1 is not connected to any of the adjacent openings (e.g., the opening 10h2). In some embodiments, the openings 10h1, 10h2 are disposed adjacent to the surface 101. Alternatively, the openings 10h1, 10h2 can be disposed adjacent to the surface 102.

Figure 1B:
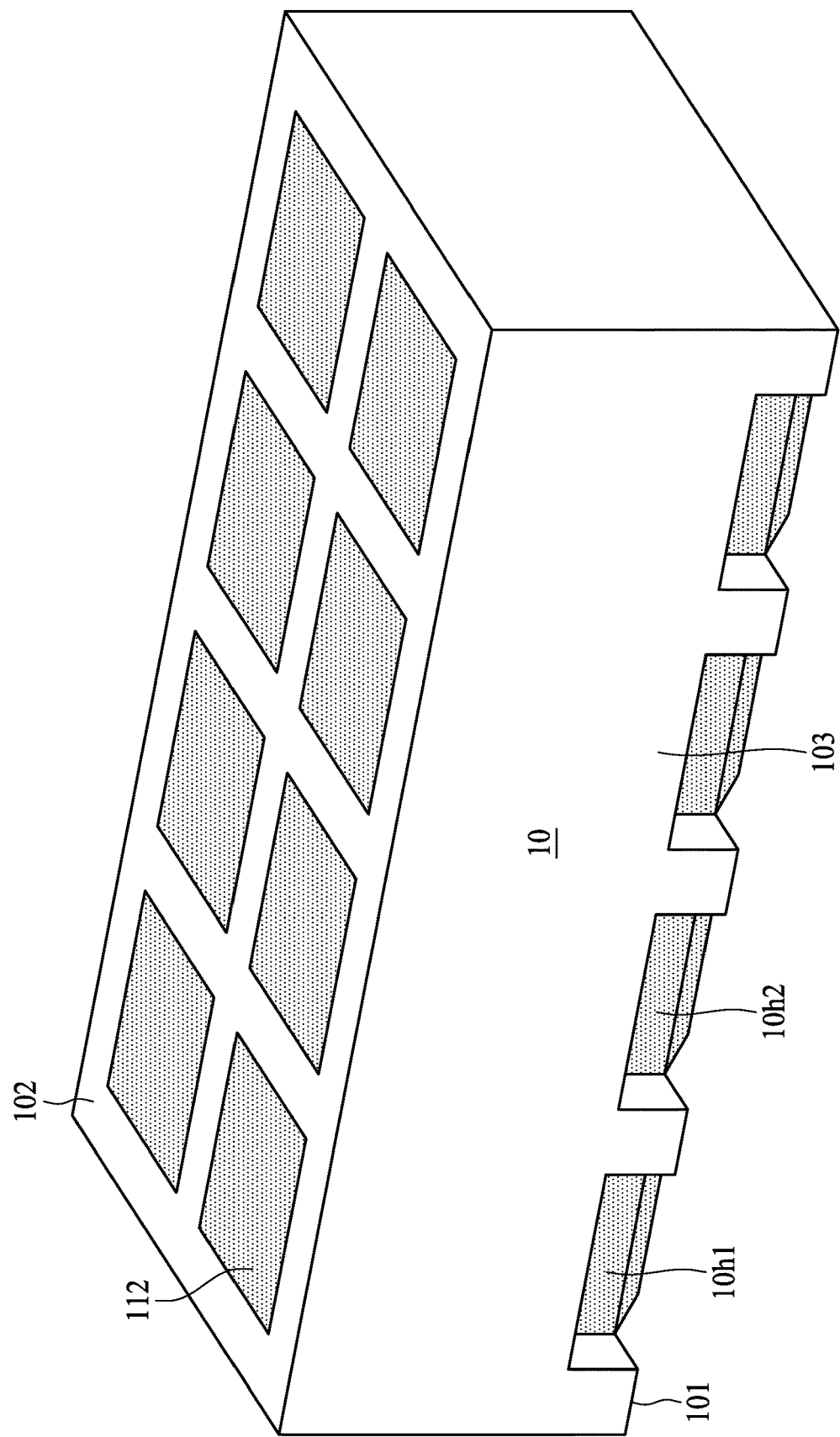
FIG. 1B illustrates a perspective view of a substrate in accordance with some embodiments of the present disclosure.

The conductive posts 11 are disposed within respective through holes of the carrier 10. For example, one conductive post is disposed within a through hole of the carrier 10. The conductive posts 11 are spaced apart or separated from each other by the carrier 10. Each conductive post 11 includes a surface 111 and a surface 112 (as shown in FIG. 1B, which illustrates a perspective view of the substrate 1 from the surface 102 of the carrier 10) opposite to the surface 111 and a surface 113 (also referred to as a lateral surface) extending between the surface 111 and the surface 112. As shown in FIG. 1A, a portion of the surface 113 of the conductive posts 11 is exposed from the openings 10h1, 10h2 of the carrier 10. In some embodiments, a width W1 of each of the openings 10h1, 10h2 is less than or equal to a width of the surface 113 of each of the conductive posts 11. In some embodiments, a depth D1 (e.g., a distance between the surface 103 of the carrier and the surface 113 of the conductive posts 11) of the each of the openings 10h1, 10h2 is substantially half of the width of each of the conductive posts 11. In some embodiments, the conductive posts 11 are formed of or include copper, copper alloy or graphene.

In some embodiments, the substrate 1 can be used as an interposer to connect an electronic component (which is disposed on the surface 102 of the carrier 10) to a printed circuit board (or another substrate), and thus conductive contacts (e.g., solder balls) may disposed on the surface 111 of the conductive posts 11 for connecting the substrate 1 to the printed circuit board. Since the openings 10h1, 10h2 are formed on the surface 103 of the carrier 10 to expose a portion of the surface 113 of the conductive posts 11, the conductive contacts would be formed not only on the surface 111 but also the surface 113 of the conductive posts 11, which can increase the contacting area between the conductive contacts and the conductive posts 11. In addition, it is easier to check whether the conductive contacts are well in contact with the conductive posts 11 through the openings 10h1, 10h2.

In some embodiments, the surface 111 of the conductive posts 11 is substantially coplanar with the surface 101 of the carrier 10 and the surface 112 of the conductive posts 11 is substantially coplanar with the surface 102 of the carrier 10. For example, a length of each of the conductive posts 11 is substantially the same as a thickness of the carrier 10. In some embodiments, each of the conductive posts 11 includes a guiding structure 11g. For example, an area of the surface 111 of the conductive posts 11 is less than an area of the surface 112 of the conductive posts 11. For example, there is a bevel connecting the surface 111 to the surface 113 of the conductive posts 11. The guiding structure 11 is used to facilitate the process of inserting each of the conductive posts 11 into the respective through hole of the carrier 10. In addition, the guiding structure 11 can prevent the carrier 10 from crack.

Figure 2:
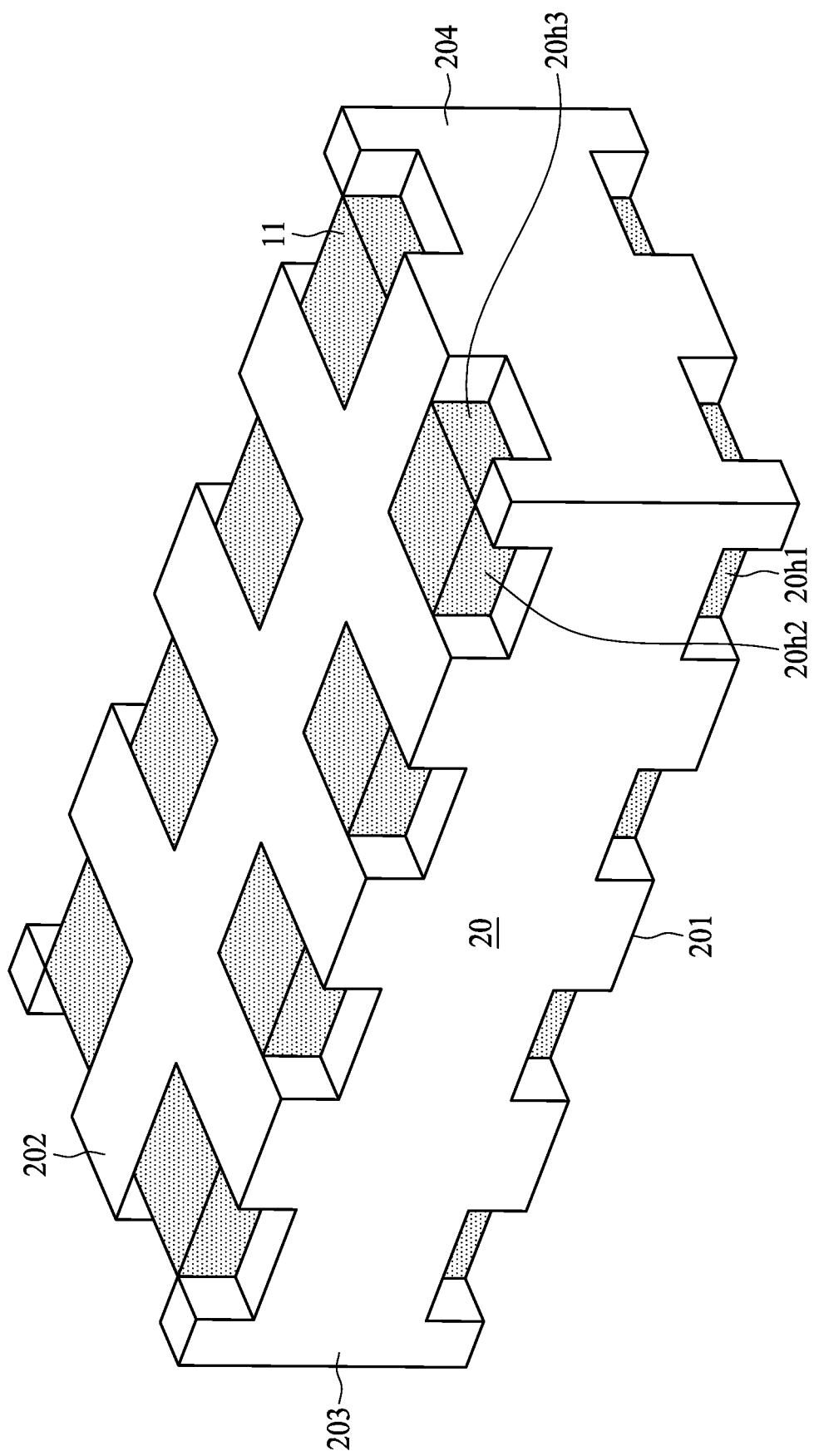
FIG. 2 illustrates a perspective view of a substrate in accordance with some embodiments of the present disclosure.

FIG. 2 illustrates a perspective view of a substrate 2 (or interposer) in accordance with some embodiments of the present disclosure. The substrate 2 is similar to the substrate 1 in FIG. 1A or 1B, except that the carrier 20 of the substrate 2 includes a plurality of openings 20h1, 20h2 adjacent to both the surface 201 and the surface 202 of the carrier 20. In addition, the carrier 20 further includes openings 20h3 on a surface 204 of the carrier 20 that is adjacent to the surface 203 of the carrier 20 and between the surface 201 and the surface 202 of the carrier 20. For example, each of the lateral surfaces (e.g., the surface 203, the surface 204, the surface opposite to the surface 203 and the surface opposite to the surface 204) of the carrier 20 includes openings. In some embodiments, the carrier 20 can be formed by injection molding technique, and the distortion or tolerance of the thickness of the carrier 20 is less than 1%. In some embodiments, the thickness of the carrier 20 is equal to or greater than 1 mm.

Figure 3:
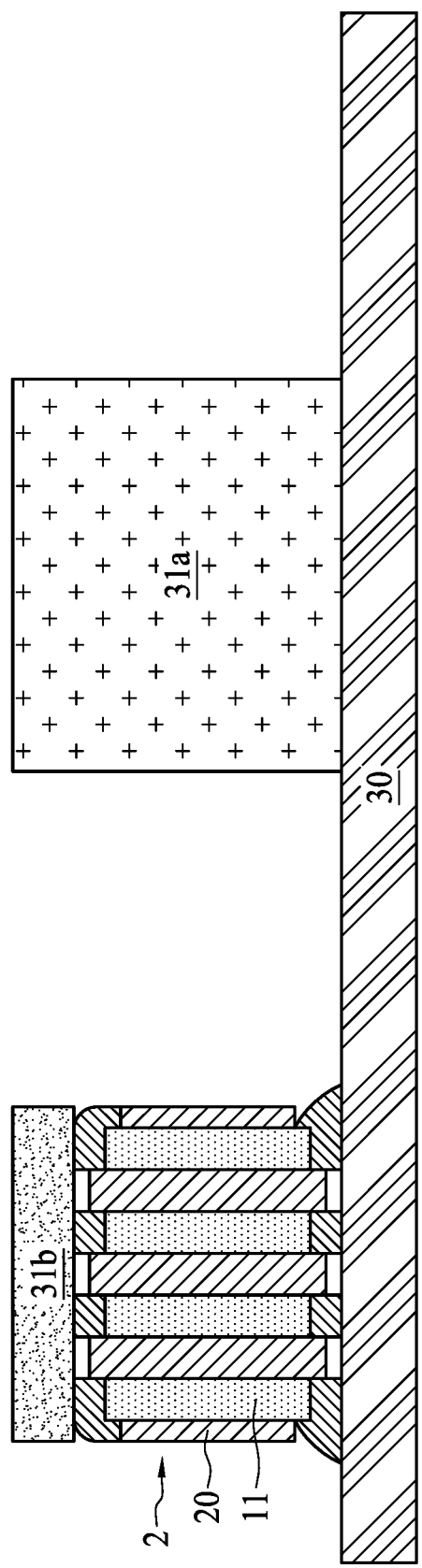
FIG. 3 illustrates a cross-sectional view of a semiconductor package in accordance with some embodiments of the present disclosure.

FIG. 3 illustrates a cross-sectional view of a semiconductor device 3 in accordance with some embodiments of the present disclosure. The semiconductor device 3 includes a substrate 30, electronic components 31a, 31b and the interposer 2 (or substrate) as shown in FIG. 2. Alternatively, the interposer 2 can be replaced by the substrate 1 in FIGS. 1A and 1B depending on design specifications.

The substrate 30 may include, for example, a printed circuit board, such as a paper-based copper foil laminate, a composite copper foil laminate, or a polymer-impregnated glass-fiber-based copper foil laminate. The substrate 30 may include an interconnection structure, such as a plurality of conductive traces (e.g., redistribution layer (RDL)) or a through via. In some embodiments, the substrate 30 includes a ceramic material or a metal plate.

The electronic component 31a is disposed on of the substrate 30. The electronic component 31a may be an active component (e.g., an integrated circuit (IC) chip or a die) or a passive electrical component (e.g., a capacitor, a resistor or an inductor). The electronic component 31a may be electrically connected to the substrate 30 (e.g., to the RDL), and electrical connection may be attained by way of flip-chip or wire-bond techniques.

The electronic component 31b is disposed on the interposer 2 and connected to the substrate 30 (e.g., to the RDL) through the conductive posts 11. A thickness of the electronic component 31b is less than in the electronic component 31a. In some applications (e.g., optical devices), the electronic components 31a, 31b should be disposed at a similar level, and thus the interposer 2 is used to be disposed between the substrate 30 and the electronic component 31b to increase its height. In some embodiments, the electronic component 31b is or includes an optical module or device (e.g., a PIN diode, a photo-diode, a photo-transistor and/or a photo detector). As mentioned above, since the carrier 20 of the interposer is formed by injection molding technique, the distortion or tolerance (e.g., less than 1%) of the thickness of the interposer 2 is much less than the existing interposer (with the distortion or tolerance of the thickness of about 10%).

Figure 4C:
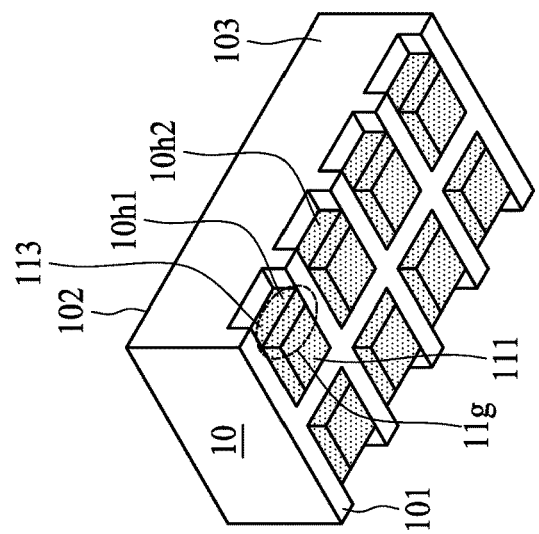
FIG. 4A, FIG. 4B and FIG. 4C illustrate a method for manufacturing a semiconductor package in accordance with some embodiments of the present disclosure.
Figure 4B:
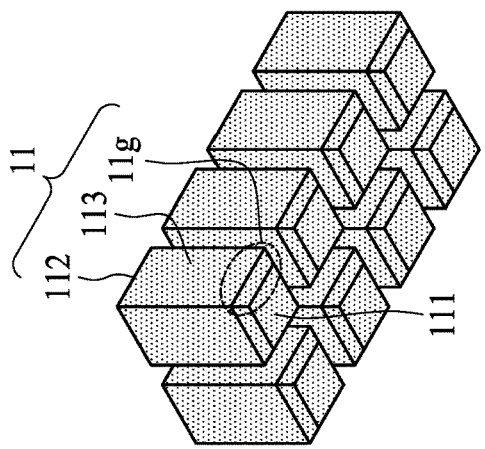
Figure 4A:
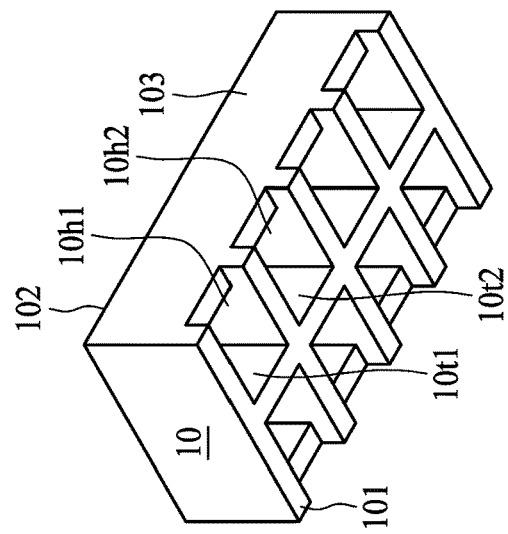

FIG. 4A, FIG. 4B and FIG. 4C illustrate a method for manufacturing the substrate 1 (or interposer) in FIGS. 1A and 1B in accordance with some embodiments of the present disclosure. Although some processes, operations or steps are described in the following with respect to each of a plurality of components, any of those processes, operations or steps may be selectively performed with respect to one of the plurality of components, or with respect to some number in between one and the full plurality of components.

Referring to FIG. 4A, the carrier 10 is formed by for example, injection molding technique. The carrier 10 has a plurality of through holes (or openings) 10t1, 10t2 penetrating the carrier 10. For example, the though holes 10t1, 10t2 extend between the surface 101 and the surface 102 of the carrier 10. The through holes 10t1 and 10t2 are separated from each other. In some embodiments, the carrier 10 is formed of or includes polymer or resin. A plurality of openings 10h1 and 10h2 are formed on the surface 103 of the carrier by, for example, cutting process, laser process or other suitable processes. The openings 10h1, 10h2 are separated from each other. For example, the opening 10h1 is not connected to any of the adjacent openings (e.g., the opening 10h2). In some embodiments, the openings 10h1, 10h2 are formed adjacent to the surface 101 of the carrier 10. Alternatively, the openings 10h1, 10h2 can be formed adjacent to the surface 102 of the carrier 10. In other embodiments, the openings can be formed adjacent to both the surface 101 and the surface 102 of the carrier 10 to for the carrier 20.

Referring to FIG. 4B, the conductive posts 11 are provided. In some embodiments, the conductive posts 11 are formed of or include copper, copper alloy or graphene. A length of each of the conductive posts 11 is substantially the same as a thickness or the height of the carrier 10. In some embodiments, each of the conductive posts 11 includes a guiding structure 11g. For example, an area of the surface 111 of the conductive posts 11 is less than an area of the surface 112 of the conductive posts 11. For example, there is a bevel connecting the surface 111 to the surface 113 of the conductive posts 11. The guiding structure 11 is used to facilitate the following process.

Referring to FIG. 4C, each of the conductive posts 11 is inserted into the respective through holes 10t1, 10t2 of the carrier 10, and then a leveling process is carried out to make the conductive posts 11 and the carrier 10 substantially coplanar. For example, the surface 111 of the conductive posts 11 is substantially coplanar with the surface 101 of the carrier 10 and the surface 112 of the conductive posts 11 is substantially coplanar with the surface 102 of the carrier 10. As shown in FIG. 4C, a portion of the surface 113 of the conductive posts 11 is exposed from the openings 10h1, 10h2 of the carrier 10.

In some embodiments, the surface 112 of the conductive posts 11 can be connected to an electronic component through solder balls and the surface 111 of the conductive posts 11 can be connected to another substrate or a circuit board through solder balls to form the semiconductor package 2 as shown in FIG. 3.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 μm, within 30 μm, within 20 μm, within 10 μm, or within 1 μm of lying along the same plane. Two components can be deemed to be "substantially aligned" if, for example, the two components overlap or are within 200 μm, within 150 μm, within 100 μm, within 50 μm, within 40 μm, within 30 μm, within 20 μm, within 10 μm, or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor substrate, comprising:
   a carrier having a first surface, a second surface opposite to the first surface and an outer lateral surface extending between the first surface and the second surface, wherein the carrier has a through hole extending between the first surface and the second surface and wherein the carrier has a first opening penetrating the outer lateral surface; and
   a conductive post disposed within the through hole, wherein the conductive post is substantially straight;
   wherein the first surface of the carrier and a projection of the conductive post in a direction substantially perpendicular to the first surface of the carrier are not overlapping.

2. The semiconductor substrate of claim 1, wherein a width of the first opening is equal to a width of a lateral surface of the conductive post.

3. The semiconductor substrate of claim 1, further comprising a second opening on the outer lateral surface of the carrier, wherein the second opening is adjacent to the first opening and spaced apart from the first opening, and wherein the first opening and the second opening are adjacent to the first surface of the carrier.

4. The semiconductor substrate of claim 1, wherein the conductive post has a first surface adjacent to the first surface of the carrier and a second surface opposite to the first surface, and an area of the first surface of the carrier is less than an area of the second surface of the carrier.

5. The semiconductor substrate of claim 1, wherein the conductive post has a surface substantially coplanar with the first surface of the carrier.

6. The semiconductor substrate of claim 1, wherein a length of the conductive post is substantially the same as a thickness of the carrier.

7. The semiconductor substrate of claim 1, wherein the outer lateral surface of carrier faces away from the conductive post.

8. The semiconductor substrate of claim 1, wherein the first opening exposes a portion of a lateral surface of the conductive post.

9. The semiconductor substrate of claim 8, wherein the lateral surface of the conductive post exposed from the first opening is recessed from the outer lateral surface of the carrier.

10. A semiconductor substrate, comprising:
a carrier having a first surface, a second surface opposite to the first surface and an outer lateral surface extending between the first surface and the second surface, wherein the carrier has a through hole extending between the first surface and the second surface and wherein the carrier has a first opening penetrating the outer lateral surface adjacent to the first surface of the carrier; and
a conductive post disposed within the through hole, the conductive post having a first surface and a second surface opposite to the first surface, wherein the first surface and the second surface of the conductive post are exposed from the carrier, and wherein the first surface of the carrier and a projection of the conductive post in a direction substantially, perpendicular to the first surface of the carrier are not overlapping.

11. The semiconductor substrate of claim 10, wherein a width of the first opening is equal to a width of a lateral surface of the conductive post.

12. The semiconductor substrate of claim 10, further comprising a second opening on the outer lateral surface of the carrier, wherein the second opening is adjacent to the first opening and spaced apart from the first opening, and wherein the first opening and the second opening are adjacent to the first surface of the carrier.

13. The semiconductor substrate of claim 10, wherein the first surface of the conductive post is substantially coplanar with the first surface of the carrier.

14. The semiconductor substrate of claim 10, wherein a length of the conductive post is substantially the same as a thickness of the carrier.

15. The semiconductor substrate of claim 10, wherein the conductive post includes a guiding structure at a terminal of the conductive post adjacent to the first surface of the carrier.

16. The semiconductor substrate of claim 10, wherein the conductive post is substantially straight.

17. The semiconductor substrate of claim 10, wherein the outer lateral surface of carrier faces away from the conductive post.

18. The semiconductor substrate of claim 10, wherein the first opening exposes a portion of a lateral surface of the conductive post.

19. The semiconductor substrate of claim 18, wherein the lateral surface of the conductive post exposed from the first opening is recessed from the outer lateral surface of the carrier.

* * * * *